United States Patent [19]
Fierkens

[11] Patent Number: 5,355,018
[45] Date of Patent: Oct. 11, 1994

[54] STRESS-FREE SEMICONDUCTOR LEADFRAME

[76] Inventor: Richard H. J. Fierkens, Keurbeek 15, 6914 AE Herwen, Netherlands

[21] Appl. No.: 174,604

[22] Filed: Dec. 28, 1993

Related U.S. Application Data

[63] Continuation of Ser. No. 904,684, Jun. 26, 1992, abandoned.

[51] Int. Cl.$^5$ .................. H01L 23/48; H01L 29/44; H01L 29/52; H01L 29/60
[52] U.S. Cl. .................. 257/669; 257/666; 361/813
[58] Field of Search .............. 257/669, 666, 670, 667, 257/734, 787, 797, 798; 361/770, 772, 773, 774, 776, 813

[56] References Cited

U.S. PATENT DOCUMENTS

| | | | |
|---|---|---|---|
| 4,496,965 | 1/1985 | Orcutt et al. | 257/666 |
| 4,803,540 | 2/1989 | Moyer et al. | 257/669 |
| 4,870,474 | 9/1989 | Karashima | 257/669 |

Primary Examiner—Andrew J. James
Assistant Examiner—Carl Whitehead, Jr.
Attorney, Agent, or Firm—Antonio R. Durando; Harry M. Weiss

[57] ABSTRACT

A semiconductor lead frame wherein the chip pad and leads are contained within a separate inner island attached to an outer frame through a plurality of independent connectors spread around the perimeter of the island. Each connector consists of a curved filament capable of compression or expansion, thereby allowing the inner island to undergo some structural deformation without transmitting it to the outer frame. As a result, alignment holes contained in the frame are not affected by mechanical stresses suffered during the molding stage of the packaging operation. Separate alignment apertures may be added to the island portion of the lead frame as additional reference markers for post-molding alignment.

6 Claims, 4 Drawing Sheets

STRESS-FREE SEMICONDUCTOR LEADFRAME

This application is a continuation of U.S. patent application Ser. No. 07/904,684 filed Jun. 26, 1992, now abandoned.

BACKGROUND OF THE INVENTION

1. Field of the Invention

This invention pertains to the general field of packages and packaging methods for semiconductor devices; in particular, the invention relates to a lead frame design that permits the trim and form operations to be carried out without interference by the mechanical stresses created during the die bonding and molding steps.

2. Description of the Prior Art

The process of manufacturing semiconductor devices involves several steps whereby an integrated circuit chip is bonded to a foil-type lead frame and encapsulated in epoxy or other molded resin. The lead frame consists of a plurality of leads etched or stamped out of a thin metallic-foil tape, and the inner ends of the leads are usually bonded to the solder bumps of the integrated circuit chip by a thermal compression method. The chip is then encapsulated in plastic by an injection molding process that results in a chip package having the outer ends of the leads exposed to the outside of the integrated circuit for connection to a circuit board. In a typical prior art system for bonding and encapsulating integrated circuits, a plurality of such circuits is linearly arranged in a single workpiece, which contains a series of identical lead frames etched or stamped on a strip of metallic substrate. A chip is bonded to each of these premanufactured lead frames and they are loaded into a bottom mold with the number of lead frames in a single batch being determined by the mold size and the capacity of the particular molding equipment being used. A top mold is moved into place atop the bottom mold and some means is provided within the molding equipment to heat the molds to the proper temperature for molding, and to subsequently cool them for curing purposes. The heated molds are clamped together by the molding equipment and when the temperature is right, usually at approximately 175° C., molding material, such as epoxy in pellet form, is placed in the mold set through bores formed in the top mold. Plungers are then inserted into the bores of the top mold and a pressurizing force is exerted on the plungers. The combination of the plunger force and the temperature causes the epoxy pellets to liquify and flow into the cavities provided in the mold set, which determine the configuration and location of the molded plastic that encapsulates the integrated circuits. Upon completion of this step, the mold set is cooled to induce curing of the epoxy; then the plungers are pulled from the mold set, the mold set is unclamped, and the top mold is lifted from the bottom mold. The lead frames are then removed from the bottom mold and carried to further equipment for trimming and forming, and otherwise operating on them to finish fabrication of the electronic circuit packages. Typically, the outer leads of each package need to be bent (formed) to conform to the requirements of the printed circuit board for which they are designed.

In order to position each lead-frame workpiece correctly within each work station performing the various steps, each lead frame contains alignment holes that match corresponding alignment pins in the supporting equipment, with which they become engaged for proper positioning at each station. These same holes are used, as the workpiece progresses through the assembly line, during the steps of bonding, molding, trimming and forming. Since each step is carried out within very narrow tolerances, it is extremely important that these alignment holes remain in constant spatial relationship with respect to the rest of the lead frame.

Unfortunately, the molding step subjects the lead frame to structural stresses caused by difference in the heat expansion coefficients of the metal and the plastic material. Thus, during the cooling phase, the encapsulated lead frame is stressed by the cooling plastic and is subjected to bending, waving and twisting of the leads. This deformation often results in a misalignment of the alignment holes in the lead frame with the receiving pins in successive work stations, which causes a mismatch between the holes and the pins and considerable quality control problems and waste. Therefore, there exists a need for an improved design of the alignment holes that results in a stress-free lead frame.

BRIEF SUMMARY OF THE INVENTION

One objective of the present invention is to provide an improved lead-frame design that results in a structure that is essentially stress free after the molding step of the packaging process.

Another objective of the invention is to achieve a stress-free condition with a lead frame that is compatible with current packaging techniques and equipment.

A concurrent objective of the invention is to provide a lead frame and method of packaging that increase the quality control of the assembly operation and reduce its overall waste and cost.

Still another goal of the invention is the ability to apply the same general concept in a variety of lead-frame designs and physical embodiments to fit the various packages and packaging methods currently known in the art.

A final objective of this invention is the realization of the above mentioned goals in an economical and commercially viable manner.

In accordance with these and other objectives, the present invention consists of a lead frame wherein the chip pad and leads are contained within a separate inner island attached to an outer frame through a plurality of independent connectors spread around the perimeter of the island. Each connector consists of a curved filament capable of compression or expansion, thereby allowing the inner island to undergo some structural deformation without transmitting it to the outer frame. As a result, the alignment holes contained in the frame are not affected by mechanical stresses suffered during the molding stage of the packaging operation. Separate alignment holes may be added to the island portion of the lead frame as additional reference markers for post-molding alignment.

Various other purposes and advantages of the invention will become clear from its description in the specification that follows, and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose but one of the various ways in which the invention may be practiced.

DETAILED DESCRIPTION OF THE INVENTION

The main feature of this invention lies in the separation of the leads and pad portion from the frame portion of a conventional lead frame, thus creating two separate and independent structures connected only through flexible connectors capable of absorbing physical stresses imposed on one structure without transmitting them to the other. As a result, the deformation typically suffered during the molding stage of packaging is not transmitted to the alignment holes in the frame and they can safely be used again for successive operations.

Figure 1:
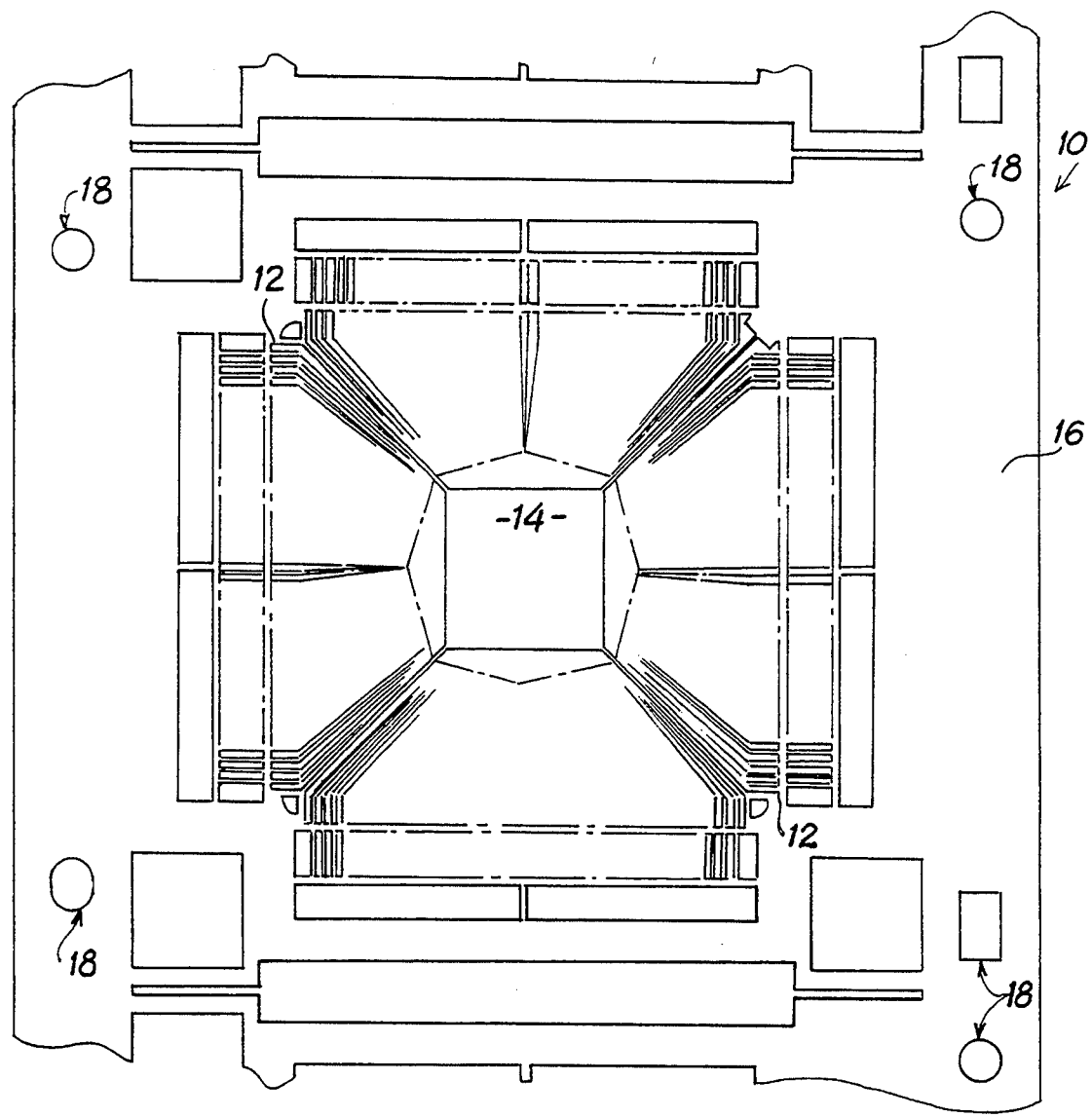
FIG. 1 is a plan view of a typical prior art lead-frame design illustrating a plurality of leads extending from a centrally-located die pad etched or stamped in a metallic foil and showing alignment holes in the body of the frame.

Referring to the drawings, wherein like parts are designated throughout with like numerals and symbols, FIG. 1 illustrates a typical segment (i.e., a single lead frame) of a strip of foil etched or stamped to obtain a series of lead frames 10. The foil can be very thin, in the order of approximately 0.08 millimeters in thickness, so that the resulting structure is very delicate and its configuration easily subjected to deformation under stress. Each lead frame contains multiple leads 12 extending outwardly from a central pad 14, resulting from the etching or stamping of foil material to form the various parts. The solid, outer, frame 16 contains alignment holes 18 intended to provide reference points for positioning the lead frame in the equipment at various work stations during the packaging process.

Corresponding equipment pins matching the position and geometry of the alignment holes 18 ensure that the holes become cooperatively engaged by the pins and that the lead frames are correctly placed and retained in the equipment for processing. As illustrated in the figure, the shape of the holes may vary, so long as matching receiving pins are used in the processing equipment.

Figure 2:
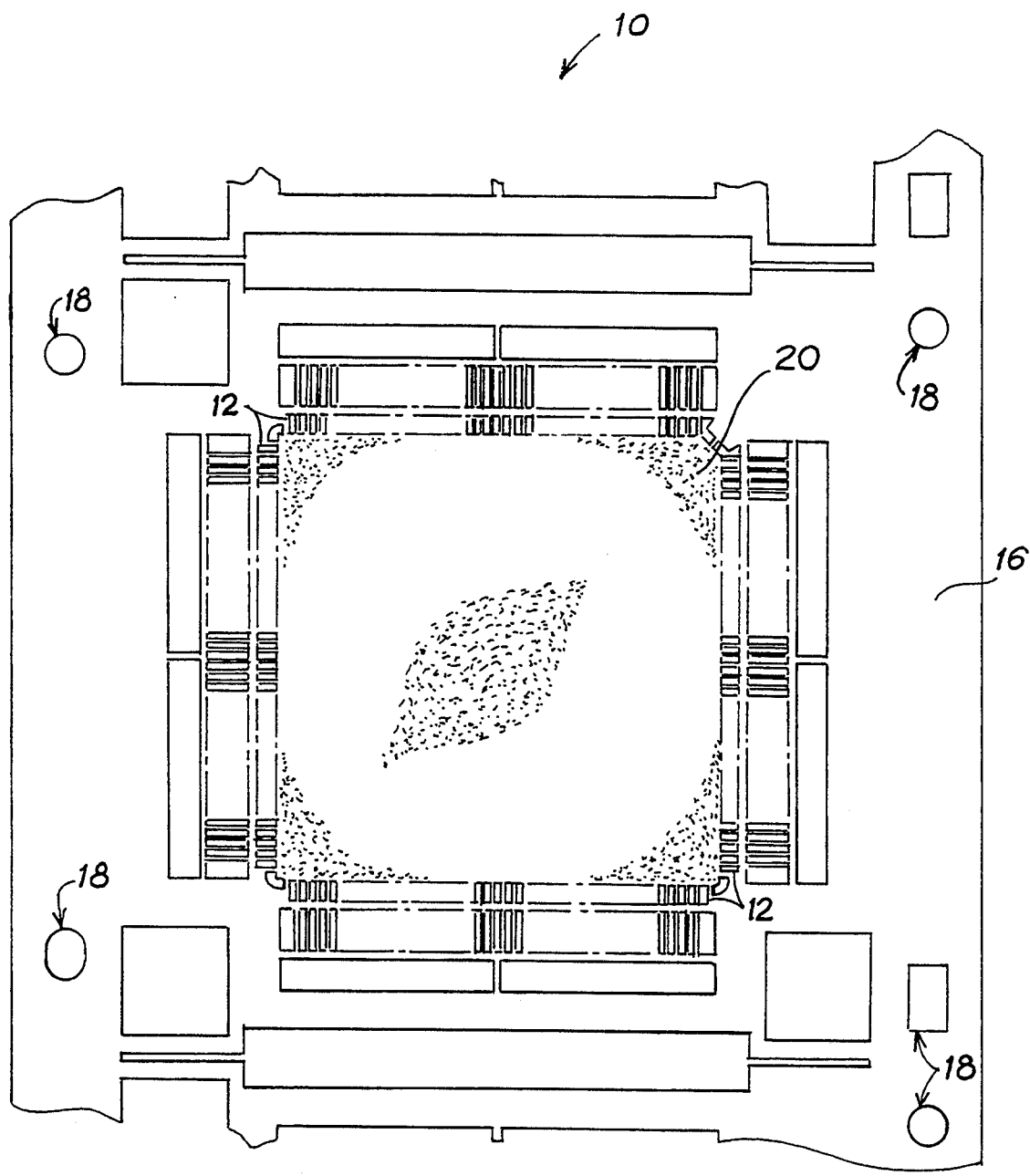
FIG. 2 is a plan view of the lead frame of FIG. 1 after bonding and encapsulation of a semiconductor chip over its pad.

As well understood by those skilled in the art, the packaging process involves bonding a semiconductor chip to the pad 14 and encapsulating it in a plastic molding. FIG. 2 illustrates the lead frame 10 of FIG. 1 including a molding 20 encapsulating the chip to form a semiconductor package ready for trimming and forming. Since the epoxy resin constituting the molding 20 is bonded to the surface of the chip and of the leads 12 to form an integral unit, any difference in the coefficient of expansion of the various materials within the unit will subject it to mechanical stresses when a temperature change occurs. Most significantly, the cooling stage from about 175° C. to room temperature after the molding operation causes stresses that often result in warpage of the lead frame and changes in the position of the alignment holes 18 relative to the molding 20 and to each other. As a result, the alignment holes may no longer fit the matching pins in the equipment downstream, and therefore may not be able to ensure alignment of the package with respect to the frame.

Figure 3:
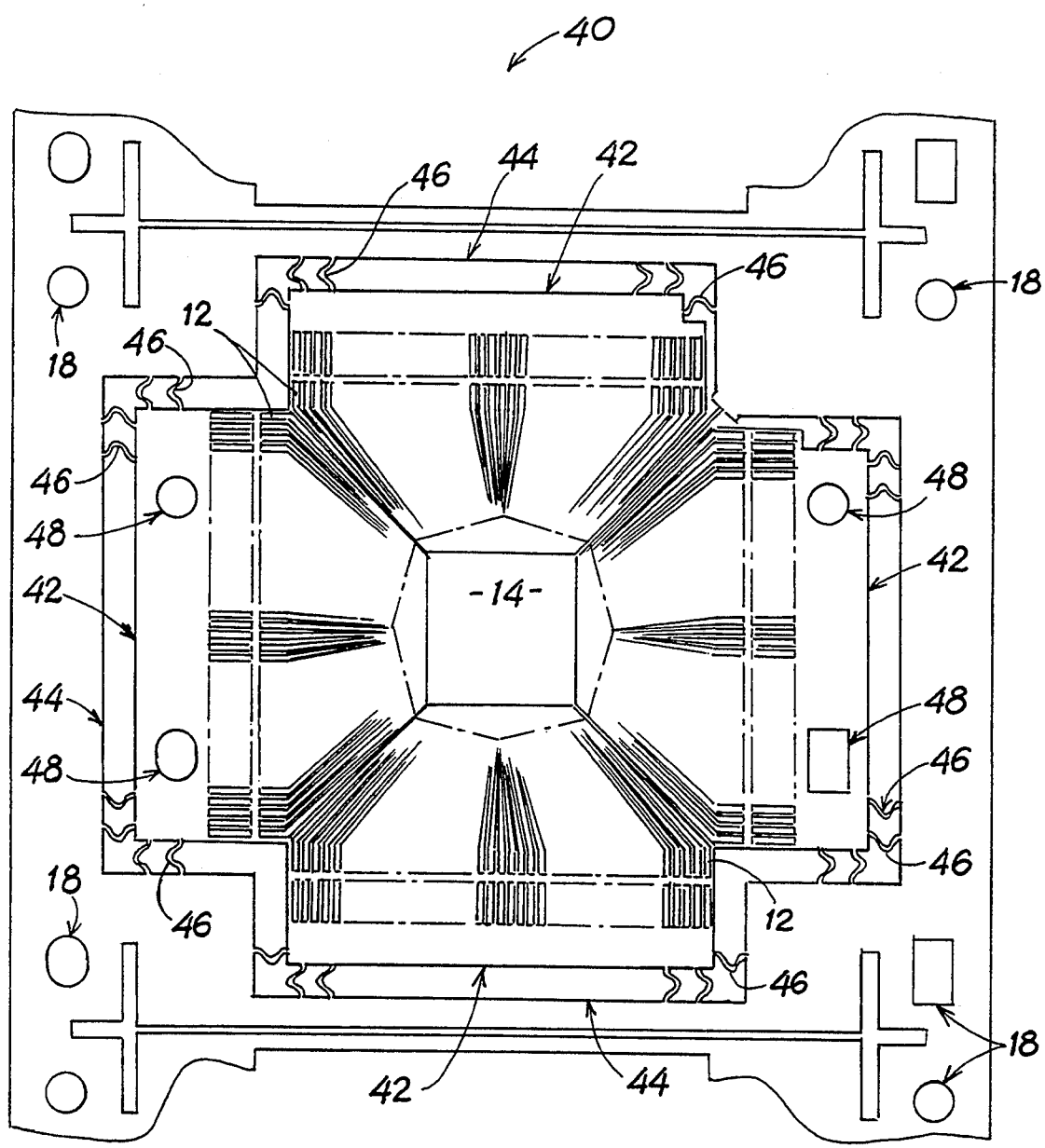
FIG. 3 is a plan view of the typical lead-frame design of FIG. 1 modified according to the present invention whereby an inner island containing a plurality of leads extending from a centrally-located die pad is attached to an outer frame by means of a plurality of independent connectors spread around the perimeter of the island.

FIG. 3 illustrates the preferred embodiment of this invention applied to the lead frame of FIGS. 1 and 2. The lead frame 40 of the invention contains the same die pad 14 and plurality of leads 12 of the prior art, but formed in an inner island 42 contained within an outer frame 44 of the lead frame 40. The inner island and outer frame are attached to one another by means of a plurality of flexible connectors 46 located at various points around the perimeter of the island. Each connector 46 is independent and consists of a curved filament with one end attached to the island and the other end attached to the frame. Because of the curvature and flexibility of the filament, it is able to adjust to changes in the shape and position of the island without transmitting them to the frame. If the island should contract, for example, the connector 46 would stretch and cause no or insignificant stress to the frame; similarly, if the island were to expand, the connector would bend and absorb the deformation within its own structure alone. In essence, by virtue of this lead frame geometry, the inner island 42 becomes virtually suspended within the outer frame 44, which in turn becomes isolated from the stresses affecting the island 42 (and the package contained therein). Thus, the alignment holes 18 are much more likely to retain their exact shape and position for alignment with corresponding pins after the molding operation.

Figure 4:
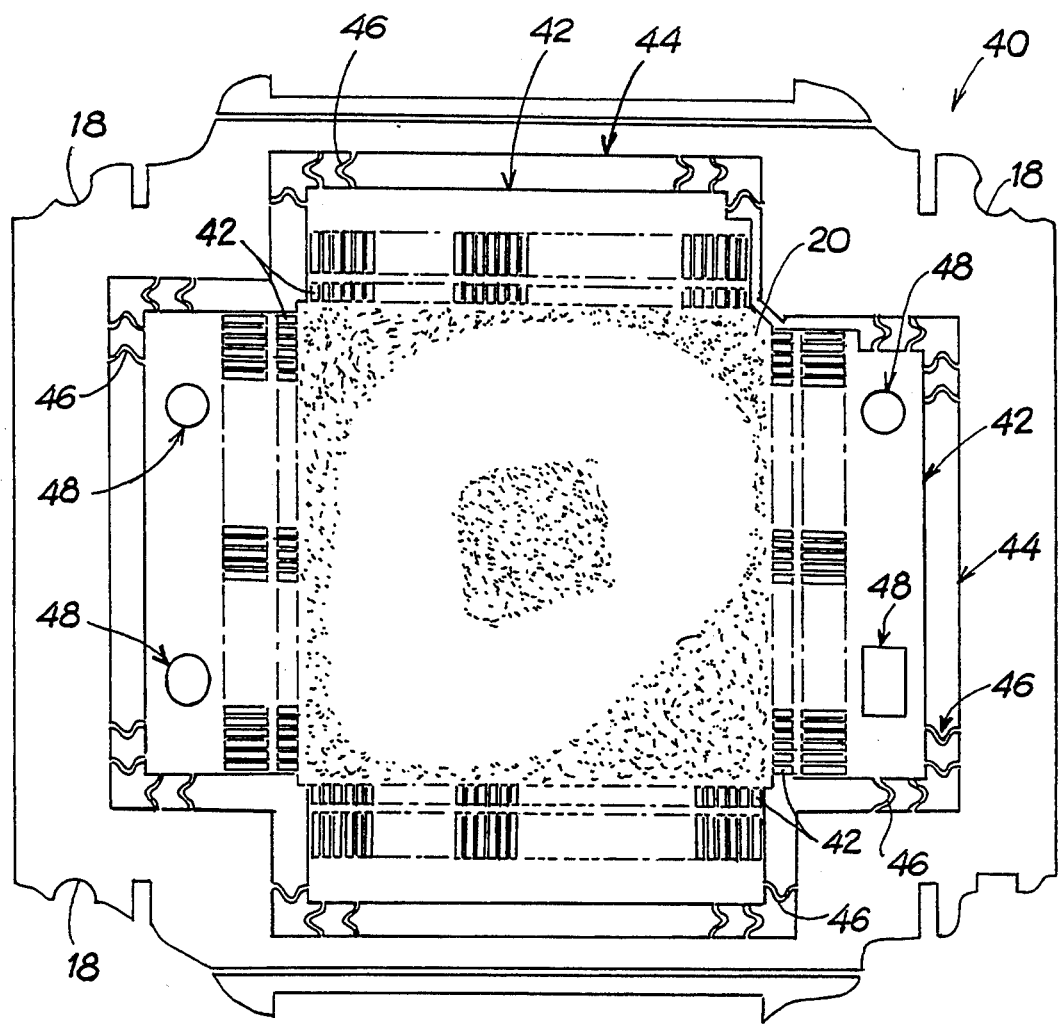
FIG. 4 is a plan view of the lead-frame design of FIG. 3 after bonding and encapsulation of a semiconductor chip over its pad.

As a further improvement over the prior art, the separation of the inner island 42 from the outer frame 44 makes it possible to introduce a separate set of alignment apertures 48, independent of the alignment holes 18, within the inner island itself. These apertures could be used, instead of the alignment holes 18 in the frame, for accurately positioning the package during the trim and form operations. FIG. 4 illustrates the functional structure of the inner island 42 for trimming and forming purposes even without the use of the alignment holes 18 in the frame 44.

The concept of the present invention may be embodied in the design of any conventional lead frame simply by modifying the etching or stamping process to include the formation of the inner island and connectors according to standard etching and stamping procedures. The new configuration is carved out of the same metallic foil used to produce the lead frames currently used in the industry. No new steps or materials are required; only modifications to the design of the lead frame structure to reflect the separation of the inner leads from the outer frame.

Therefore, various changes in the details, steps and materials that have been described may be made by those skilled in the art within the principles and scope of the invention herein illustrated and defined in the appended claims. It is recognized that departures can be made from the preferred embodiment within the scope of the invention, which is therefore not to be limited to the details disclosed herein, but is to be accorded the full scope of the claims, so as to embrace any and all equivalent apparatus and methods.

I claim:

1. A stress-free semiconductor lead frame formed in a conventional metallic substrate for use in conventional packaging equipment, comprising:

(a) an outer frame comprising a plurality of alignment holes for cooperative engagement with corresponding outer receiving pins in the packaging equipment;

(b) an inner island contained within said outer frame and comprising a die pad and a plurality of metallic leads extending therefrom;

(c) a plurality of alignment apertures comprised within said inner island for cooperative engagement with a corresponding plurality of inner receiving pins in the packaging equipment, said alignment apertures being disposed outside said die pad in the inner island; and (d) flexible connection means for attaching said inner island to said outer frame, said flexible connection means being the only connection between the inner island and the outer frame; wherein said connection means is capable of compression and expansion, thereby absorbing mechanical stresses resulting from structural deformations of said inner island without transmitting them to said outer frame.

2. The lead frame of claim 1, wherein said connection means consists of a plurality of independent connectors located around the perimeter of said inner island.

3. The lead frame of claim 2, wherein each of said connectors consists of a curved filament with one end attached to the island and the other end attached to the frame.

4. The lead frame of claim 3, wherein each of said filaments is formed out of a metallic foil used to produce the lead frame.

5. The lead frame of claim 1, wherein said lead frame is formed by a metal etching process.

6. The lead frame of claim 1, wherein said lead frame is formed by a metal stamping process.

* * * * *